United States Patent
Konno

[11] Patent Number: 5,305,388
[45] Date of Patent: Apr. 19, 1994

[54] BASS COMPENSATION CIRCUIT FOR USE IN SOUND REPRODUCTION DEVICE

[75] Inventor: Fumiyasu Konno, Matsuzaka, Japan

[73] Assignee: Matsushita Electric Industrial Co., Ltd., Osaka, Japan

[21] Appl. No.: 899,186

[22] Filed: Jun. 16, 1992

[30] Foreign Application Priority Data

Jun. 21, 1991 [JP] Japan .................. 3-150034

[51] Int. Cl.⁵ .............. H03G 9/00; H04R 5/00; H03H 5/00; H04B 1/10
[52] U.S. Cl. ...................... 381/102; 381/28; 333/28 T; 328/167
[58] Field of Search .......... 381/98, 101, 102, 28; 333/28 T, 167, 172, 174; 307/521, 520, 522; 328/167

[56] References Cited
U.S. PATENT DOCUMENTS

| | | |
|---|---|---|
| 4,490,843 | 12/1984 | Bose et al. |
| 4,538,298 | 8/1985 | Bose |
| 4,698,842 | 10/1987 | Mackie et al. ............. 381/98 |
| 4,739,514 | 4/1988 | Short et al. |
| 5,034,984 | 7/1991 | Bose |

Primary Examiner—Curtis Kuntz
Assistant Examiner—P. W. Lee
Attorney, Agent, or Firm—Lowe, Price, LeBlanc & Becker

[57] ABSTRACT

A bass compensation circuit for use in a sound reproduction device is provided with a second-order positive feedback type high-pass filter. The filter has an operational amplifier and a first positive feedback resistor, a first variable resistor connected to an input terminal for receiving an input signal, coupled with a second variable resistor for volume control, and a second resistor for determining a Q-value and a cut-off frequency of a second-order positive feedback type high-pass filter. The first variable resistor and the second resistor are inserted in series between the first resistor and the ground. Thus, the bass compensation circuit can amplify only low frequency signals which do not serve as a masking sound used in masking middle and high frequency signals and has a low level when the sound volume is low. Moreover, the Q-value and the cut-off frequency of the second-order positive feedback type high-pass filter can continuously be changed by using the second variable resistor. Consequently, the Q-value and the cut-off frequency of the second-order positive feedback type high-pass filter can change in a natural manner against a change in sound volume.

2 Claims, 2 Drawing Sheets

BASS COMPENSATION CIRCUIT FOR USE IN SOUND REPRODUCTION DEVICE

BACKGROUND OF THE INVENTION

1. Field of the Invention

This invention relates to a bass compensation circuit for use in a sound reproduction device.

2. Description of the Related Art

First, a conventional sound reproduction device provided with a range correction circuit (namely, a tone control circuit or an equalizer) will be described hereinbelow by referring to the accompanying drawings. FIG. 3 is a circuit diagram for illustrating the configuration of the range correction circuit provided in the conventional sound reproduction device and adapted to change relative levels of amplitude (hereunder sometimes referred to simply as levels) at frequencies of middle and high frequency ranges and of a low frequency range correspondingly to change in sound volume. As shown in this figure, a variable resistance with a center tap is employed as a variable resistor 13 for volume control. Further, a time constant circuit comprised of resistances 16 and 17 and capacitors 14 and 15 is connected to the variable resistor 13. Circuit constants of this time constant circuit are determined in such a manner that the reactance of the capacitor 14 is sufficiently high but that of the capacitor 15 is low correspondingly to frequencies of a middle frequency range. Further, levels at frequencies of the middle frequency range can be changed only by regulating the variable resistor 13. Moreover, levels at frequencies of a high frequency range rise due to reduction in reactance of the capacitor 14. Furthermore, levels at frequencies of a low frequency range rise owing to increase in reactance of the capacitor 15. Additionally, the conventional sound reproduction device provided with this circuit employing a frequency response (namely, frequency characteristics), the graph of which is as illustrated in FIG. 4, in order to realize a well-known loudness contour.

As is seen from FIG. 4, the frequency response of the conventional sound reproduction device provided with the range correction circuit gently changes in a frequency range, the center frequency of which is 1 kilohertz (kHz). As the result, in case where sound volume is small, a listener has a feeling of indistinctness toward sounds of frequencies of middle and low frequency ranges. Especially, a listener feels as if a vocal part were turned down. Even if such a frequency response is improved and a rolloff frequency is regulated in such a manner to increase levels at frequencies of low and high frequency ranges, it is difficult to increase only levels at necessary frequencies, because of the fact that basically, the circuit has a first-order filter arrangement. The present invention is created to resolve such a problem of the conventional circuit.

It is, therefore, an object of the present invention to provide a bass compensation circuit for use in a sound reproduction device, which can compensate a frequency response at desired frequencies of a low frequency range, which are necessary for music reproduction in such a way that the compensated frequency response can change against change in sound volume in a natural manner.

SUMMARY OF THE INVENTION

To achieve the foregoing object, in accordance with an aspect of the present invention, there is provided a bass compensation circuit for use in a sound reproduction device, which comprises a second-order positive feedback type high-pass filter having an operational amplifier and a first resistor operative to be a positive feedback resistance, a coupling type variable resistor coupled with another variable resistor for volume control, and a second resistor for determining a Q-value and a cutoff frequency of the second-order positive feedback type high-pass filter, wherein the variable resistor and the second resistor are inserted in series between the first resistor and the ground.

With this configuration, the bass compensation circuit of the present invention can amplify only a signal representing a sound having a frequency of a low frequency range, which does not serve as a masking sound to be used in performing a masking of sounds having frequencies of middle and high frequency ranges and has a low level especially when a corresponding sound volume is small. Moreover, the Q-value and cutoff frequency of the second-order positive feedback type high-pass filter can continuously be changed by using the variable resistor for volume control. Thus the Q-value and cutoff frequency of the second-order positive feedback type high-pass filter can change in a natural manner against change in sound volume. Namely, differently from the conventional loudness control circuit, the bass compensation circuit according to the present invention can compensate only a low frequency range correspondingly to every sound volume. As a result, the bass compensation circuit of the present invention can provide a natural tone or frequency response without substantial change in levels at frequencies of middle and high frequency ranges. Especially, the bass compensation circuit is effective in compensating a masking of sounds having frequencies of a low frequency range due to what is called a load noise of an on-board sound reproduction system or a relatively small bass-reflex enclosure.

Incidentally, in case of an on-board sound reproduction system, there is a limit to reproduction of sounds having frequencies of a low frequency range because the room of a car is small. Moreover, sounds having frequencies of a low frequency range are often cut or attenuated owing to poor installation of loudspeakers. Such a problem can be resolved by employing the bass compensation circuit of the present invention, which can raise the levels at frequencies of a low frequency range while cutting sounds having frequencies of an ultra-low frequency range. At the maximum of sound volume, the bass compensation circuit serves as a low-cut filter and thus can prevent an occurrence of a distortion to be resulted from what is called an over-amplitude phenomenon of a loudspeaker.

BRIEF DESCRIPTION OF THE DRAWINGS

Other features, objects and advantages of the present invention will become apparent from the following description of a preferred embodiment with reference to the drawings in which like reference characters designate like or corresponding parts throughout several views, and in which.

DETAILED DESCRIPTION OF THE PREFERRED EMBODIMENT

Hereinafter, a bass compensation circuit for use in a sound reproduction device, which is a preferred embodiment of the present invention, will be described in detail by referring to the accompanying drawings.

Figure 1:
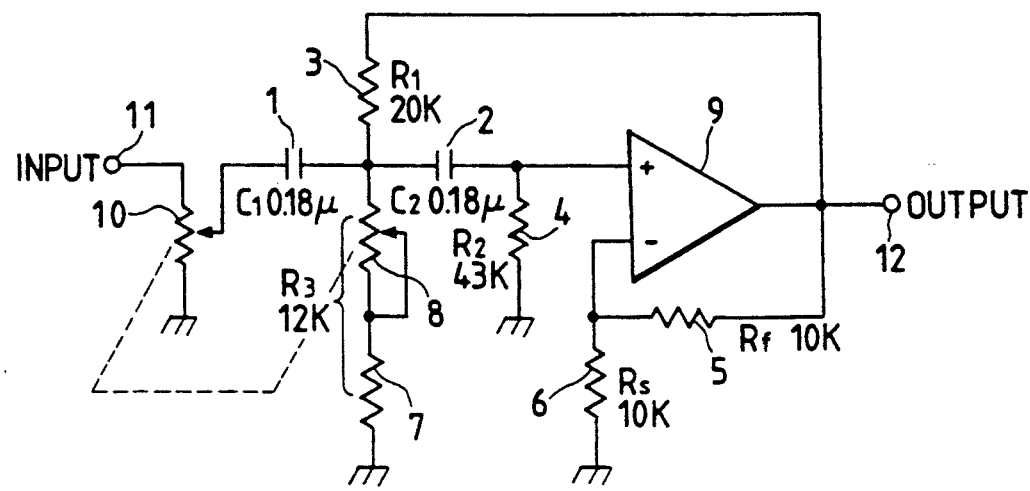
FIG. 1 is a circuit diagram for illustrating the configuration of a bass compensation circuit of a sound reproduction device embodying the present invention.

FIG. 1 is a circuit diagram for illustrating the configuration of a bass compensation circuit of a sound reproduction device embodying the present invention. As shown in this figure, a second-order positive feedback type high-pass filter is comprised of a first capacitor 1, a second capacitor 2, a first resistor 3, a second resistor 4, a third resistor 5, a fourth resistor 6 and an operational amplifier 9. Further, a terminal of a coupling type variable resistor 8 coupled with a variable resistor 10 for volume control is connected to an input terminal of the second-order positive feedback type high-pass filter. The other terminal of the resistor 8 is connected in series to a fifth resistor 7 for determining the cut-off frequency and Q-value of the second-order positive feedback type high-pass filter.

Let $C_1$ denotes the capacitance of the first capacitor 1; $C_2$ the capacitance of the second capacitor 2; $R_1$ the resistance of the first resistor 3; $R_2$ the resistance of the second resistor 4; $R_f$ the resistance of the third resistor 5; $R_s$ the resistance of the fourth resistor 6; and $R_3$ the combined resistance of the combination of the fifth resistor 7 and the coupling type variable resistor 8 connected in series with each other. In practice, the values of $C_1$, $C_2$, $R_1$, $R_2$, $R_f$, $R_s$ and $R_3$ are set as indicated in FIG. 1. The transfer function of the bass compensation circuit of the sound reproduction device of the present invention, which has the above described configuration, is practically given by the following equation (1):

$$\text{Output Voltage/Input Voltage} = KS^2/[S^2 + S\{(1/R_2C_1) + (1/R_2C_2) + (1-K)(1/R_1C_1) + (1/R_3C_1)\} + \{(R_1 + R_3)/C_1C_2R_1R_2R_3\}] \quad (1)$$

where $S = j\omega$ and $K = 1 + (R_1/R_3)$.

Further, the cut-off frequency $f_c$ and the Q-value Q of the device are given by the following equations (2) and (3), respectively:

$$f_c = (1/2\pi)\sqrt{\{(R_1 + R_3)/C_1C_2R_1R_2R_3\}} \quad (2)$$

$$Q = 1/[\sqrt{\{R_3/(R_1 + R_3)\}} \{\sqrt{(C_2R_1/C_1R_2)} + \sqrt{(C_1R_1/C_2R_2)} + (1-K)\sqrt{(C_2R_2/C_1R_1)} + \sqrt{(C_2R_1R_2 + C_1R_3^2)}\}] \quad (3)$$

As can be understood from the equations (2) and (3), if the combined resistance $R_3$ of the combination of the fifth resistor 7 and the coupling type variable resistor 8 decreases, the Q-value decreases but the cut-off frequency $F_c$ increases. Thus, the Q-value Q and the cut-off frequency $f_c$ of the device can be changed by means of the variable resistor 10 for volume control by connecting the coupling type variable resistor 8 to the variable resistor 10 in such a manner that the resistance of the resistor 8 decreases when the sound volume is increased by changing the variable resistor 10.

Moreover, in this case, the gain of the device decreases at a rate of approximately 12 decibels/octave (dB/oct) in a low frequency range, the frequencies of which are higher than the rolloff frequency of the device. Thus an occurrence of what is called an overamplitude phenomenon of a loudspeaker can be prevented by setting the Q-value as 0.7 or so when the sound volume stands at its maximum value and also setting the Q-value as a large value when the sound volume is small.

Figure 2:
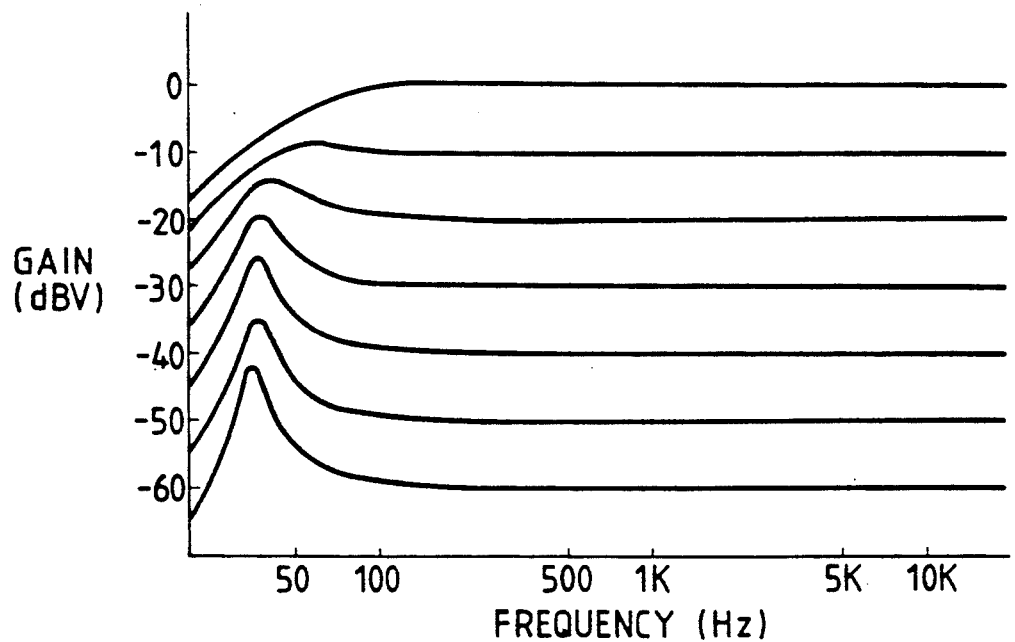
FIG. 2 is a graph for illustrating the frequency response of the sound reproduction device provided with the bass compensation circuit according to the present invention as illustrated in FIG. 1.
Figure 3:
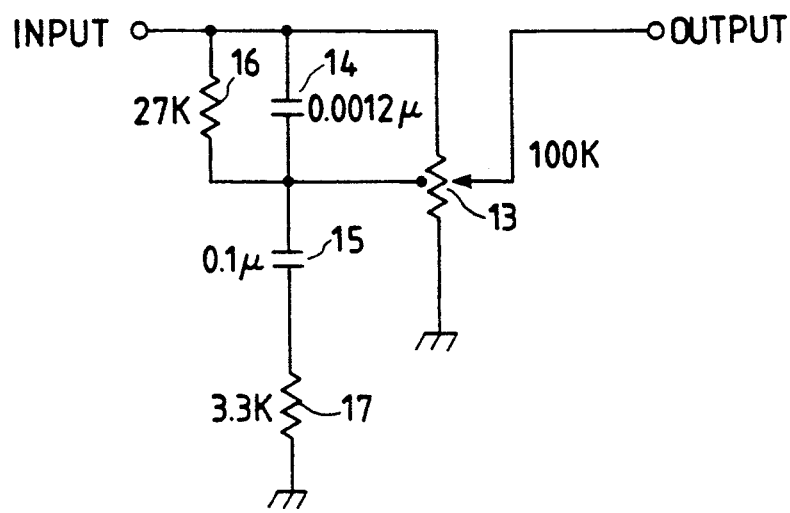
FIG. 3 is a circuit diagram for illustrating the configuration of a range correction circuit of a conventional sound reproduction device.
Figure 4:
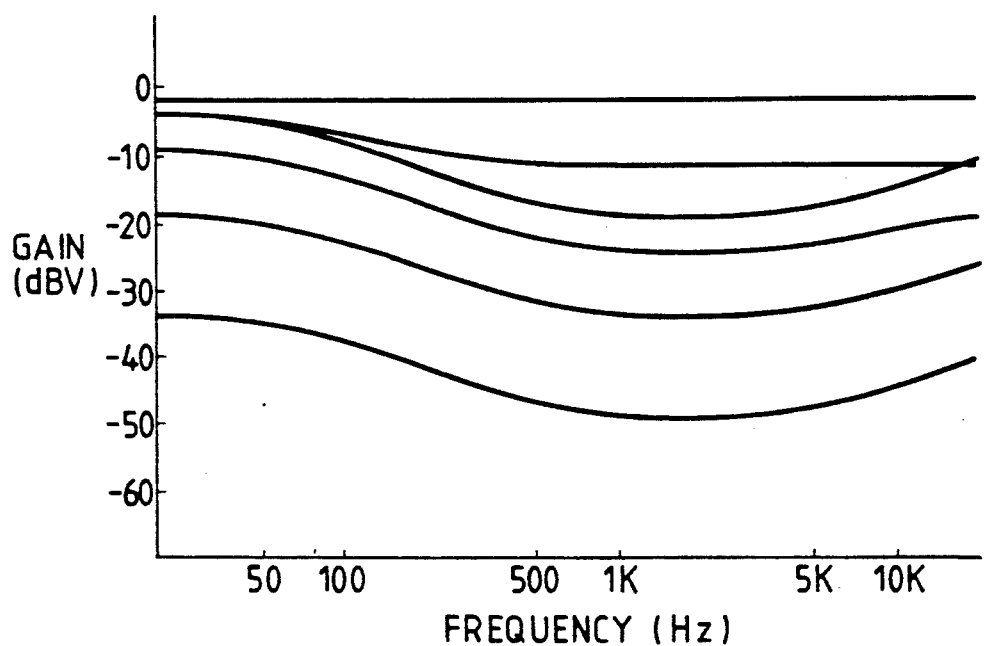
FIG. 4 is a graph for illustrating the frequency response of the conventional sound reproduction device provided with the range correction circuit of FIG. 3.

Referring to FIG. 2, there is shown change in frequency response of the device in case where the resistance of the variable resistor 10 is changed.

While a preferred embodiment of the present invention has been described above, it is to be understood that the present invention is not limited thereto and that other modifications will be apparent to those skilled in the art without departing from the spirit of the invention. The scope of the present invention, therefore, is to be determined solely by the appended claims.

What is claimed is:

1. A bass compensation circuit for use in a sound reproduction device, comprising:

a first variable resistor, connected to an input terminal for receiving an input signal, having a tap for volume control;

a second-order positive feedback type high-pass filter having:

a first capacitor having a first terminal and a second terminal, the first terminal of the first capacitor being connected to the tap of the first variable resistor;

a second capacitor having a first terminal and a second terminal, the first terminal of the second capacitor being connected to the second terminal of the first capacitor;

a first resistor having a first terminal and a second terminal, the first terminal of the first resistor being connected to the second terminal of the first capacitor;

a second resistor having a first terminal and a second terminal, the first terminal of the second resistor being connected to the second terminal of the second capacitor, the second terminal of the second resistor being grounded;

an operational amplifier having a non-inverting terminal, an inverting terminal and an output terminal, the non-inverting terminal of the operational amplifier being connected to the second terminal of the second capacitor and to the first terminal of the second resistor, the second terminal of the first resistor being connected to the output terminal of the operational amplifier, the output terminal of the operation amplifier being the output terminal of the circuit;

a third resistor having a first terminal and a second terminal, the first terminal of the third resistor being connected to the output terminal of the operational amplifier, the second terminal of the third resistor being connected to the inverting terminal of the operational amplifier; and a fourth resistor having a first terminal and a second terminal, the first terminal of the fourth resistor being connected to the inverting terminal of the operational amplifier and to the second terminal of the third resistor, the second terminal of the fourth resistor being grounded;

a second variable resistor adapted to change resistance thereof correspondingly to change in resistance of the first variable resistor, the second variable resistor having a first terminal and a second terminal, the first terminal of the second variable resistor being connected to the second terminal of the first capacitor of the second-order positive feedback type high-pass filter; and a fifth resistor having a first terminal and a second terminal, the first terminal of the fifth resistor being connected to the second terminal of the second variable resistor, the second terminal of the fifth resistor being grounded, the fifth resistor determining a cut-off frequency and a Q-value of the second-order positive feedback type high-pass filter, wherein the determined cutoff frequency and Q-value of the high pass filter compensate the frequency response at a low frequency range.

2. The bass compensation circuit according to claim 1, wherein the Q-value and the cut-off frequency of the second-order positive feedback type high-pass filter are changed according to the first variable resistor.

* * * * *